(12) United States Patent
Sheng (10) Patent No.: US 11,219,940 B2
(45) Date of Patent: Jan. 11, 2022

(54) MANUFACTURING METHOD OF MIDDLE MEMBER STRUCTURE

(71) Applicant: ASIA VITAL COMPONENTS CO., LTD., New Taipei (TW)

(72) Inventor: Wei-Kong Sheng, New Taipei (TW)

(73) Assignee: Asia Vital Components Co., Ltd., New Taipei (TW)

(*) Notice: Subject to any disclaimer, the term of this patent is extended or adjusted under 35 U.S.C. 154(b) by 152 days.

(21) Appl. No.: 16/420,172

(22) Filed: May 23, 2019

(65) Prior Publication Data

US 2020/0108434 A1  Apr. 9, 2020

Related U.S. Application Data

(63) Continuation-in-part of application No. 16/150,285, filed on Oct. 3, 2018, now Pat. No. 11,131,508.

(51) Int. Cl.
| | |
|---|---|
| *B21D 53/04* | (2006.01) |
| *B29C 39/02* | (2006.01) |
| *B21D 28/02* | (2006.01) |
| *B21D 13/02* | (2006.01) |

(52) U.S. Cl.
CPC .......... *B21D 53/04* (2013.01); *B21D 28/02* (2013.01); *B29C 39/026* (2013.01); *B21D 13/02* (2013.01)

(58) Field of Classification Search
CPC ........ B21D 13/02; B21D 28/02; B21D 28/24; B21D 53/04; B23P 15/26; B23P 2700/09; B29C 2793/0045; B29C 2793/009; B29C 39/026; B29C 53/24; B29D 99/0014; B29L 2031/18; F28D 15/0233; F28F 21/089; F28F 2245/00; H01L 23/3672; H01L 23/427

See application file for complete search history.

(56) References Cited

U.S. PATENT DOCUMENTS

| | | | |
|---|---|---|---|
| 8,316,921 B2* | 11/2012 | Hou | H05K 7/20336 165/80.2 |
| 2007/0240860 A1 | 10/2007 | Meyer, IV et al. | |
| 2010/0294200 A1* | 11/2010 | Zhang | F28D 15/046 118/728 |
| 2014/0082943 A1* | 3/2014 | Yang | F28D 15/046 29/890.032 |
| 2016/0161198 A1* | 6/2016 | Riendeau | F28F 3/02 165/133 |

FOREIGN PATENT DOCUMENTS

| | | |
|---|---|---|
| CN | 101520286 A | 9/2009 |
| CN | 102840785 A | 12/2012 |

(Continued)

*Primary Examiner* — Robert J Grun
(74) *Attorney, Agent, or Firm* — Bradley J. Thorson; DeWitt LLP (57) ABSTRACT

A manufacturing method of middle member structure includes steps of applying an external force to a plate body to shape the plate body and form multiple recessed/raised structures and perforating the plate body to form multiple perforations misaligned from the recessed/raised structures so as to achieve a plate body with recessed/raised structures. The middle member structure is applicable to a vapor chamber to enhance the vapor-liquid circulation effect and the support for the internal chamber.

8 Claims, 12 Drawing Sheets

(56) References Cited

FOREIGN PATENT DOCUMENTS

| | | |
|---|---|---|
| CN | 103398613 A | 11/2013 |
| CN | 105973045 A | 9/2016 |
| CN | 106152818 A | 11/2016 |
| CN | 107809880 A | 3/2018 |
| CN | 108534574 A | 9/2018 |
| TW | 200722701 | 6/2007 |
| TW | 200912237 | 3/2009 |
| TW | 200936976 | 9/2009 |
| TW | M522322 U | 5/2016 |

* cited by examiner

Fig. 3 forming a plate body with recessed/raised structures on the surface by means of molding or injection molding — S1 perforating the plate body to form multiple perforations misaligned from the recessed/raised structures — S2

MANUFACTURING METHOD OF MIDDLE MEMBER STRUCTURE

The present application is a continuation in part of U.S. patent application Ser. No. 16/150,285, filed on Oct. 3, 2018.

BACKGROUND OF THE INVENTION

1. Field of the Invention

The present invention relates generally to a manufacturing method of middle member structure, and more particularly to a manufacturing method of middle member structure, which is able to enhance the vapor-liquid circulation effect of a vapor chamber and enhance the support strength for the vapor chamber.

2. Description of the Related Art

Nowadays, the heat pipe and vapor chamber are the most often seen heat transfer components. The working principle of heat pipe and vapor chamber is that a working fluid is filled in an airtight chamber and a capillary structure is disposed in the airtight chamber to perform two-phase heat exchange. The heat pipe is a heat transfer component mainly serving to conduct heat to a remote end. The plate-shaped vapor chamber is a two-dimensional heat transfer component serving to face-to-face transfer heat. Along with the advance of the heat transfer technique, the vapor chamber and the heat pipe have become thinner and thinner and widely applied to handheld mobile devices and wearing devices for conducting and dissipating heat.

After thinned, the vapor passages of the vapor chamber and the heat pipe are also compressed and narrowed. Therefore, the vapor passage is apt to collapse. As a result, the vapor and the liquid cannot be separated and the vapor cannot spread. In this case, the heat conduction efficiency of the vapor chamber and the heat pipe will be deteriorated or even the vapor chamber and the heat pipe will malfunction. It is therefore tried by the applicant to provide a manufacturing method of middle member structure, which can prevent the vapor passage of the thinned vapor chamber from collapsing and avoid failure of the vapor chamber. Also, the middle member structure is able to effectively enhance the vapor-liquid circulation efficiency of the vapor chamber.

SUMMARY OF THE INVENTION

It is therefore a primary object of the present invention to provide a manufacturing method of middle member structure, which is able to enhance the vapor-liquid circulation efficiency of a vapor chamber and provide support effect for the vapor chamber.

To achieve the above and other objects, the manufacturing method of middle member structure of the present invention includes steps of:
providing a plate body;
applying an external force to the plate body to shape the plate body and form multiple recessed/raised structures; and
perforating the plate body to form multiple perforations misaligned from the recessed/raised structures.

To achieve the above and other objects, the manufacturing method of middle member structure of the present invention includes steps of:
forming a plate body with recessed/raised structures on the surface by means of molding or injection molding; and
perforating the plate body to form multiple perforations misaligned from the recessed/raised structures.

To achieve the above and other objects, the manufacturing method of middle member structure of the present invention includes steps of:
providing a first plate body and a second plate body;
forming recessed/raised structures on the surfaces of the first and second plate bodies by means of external force shaping or in-mold molding;
perforating the first and second plate bodies to form multiple perforations misaligned from the recessed/raised structures; and
integrally connecting the first and second plate bodies with each other.

The present invention provides a manufacturing method of middle member structure. The middle member structure made by the manufacturing method is applicable to a vapor chamber or a flat-plate heat pipe to enhance the support strength for the internal chamber and enhance the vapor-liquid circulation effect.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
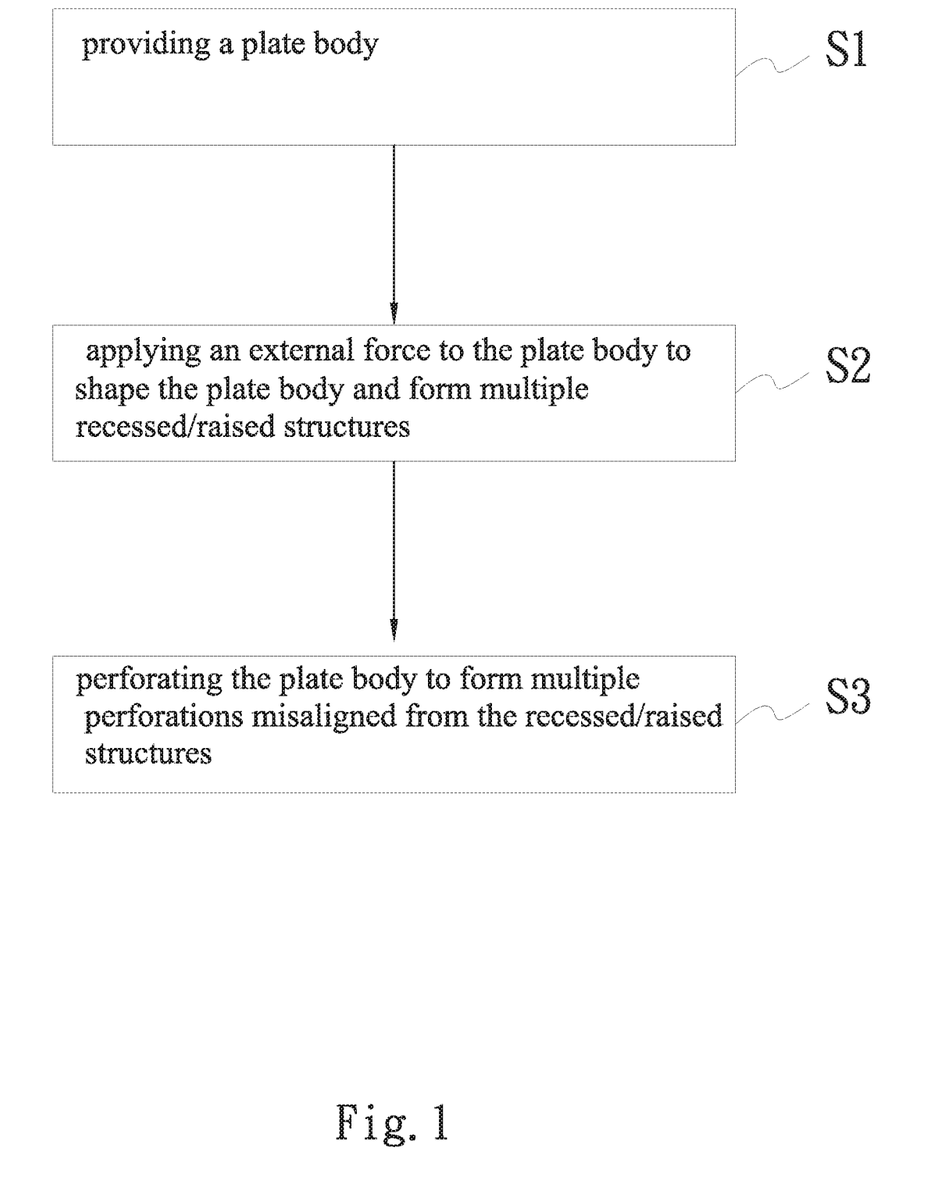
FIG. 1 is a flow chart of a first embodiment of the manufacturing method of middle member structure of the present invention.
Figure 2A:
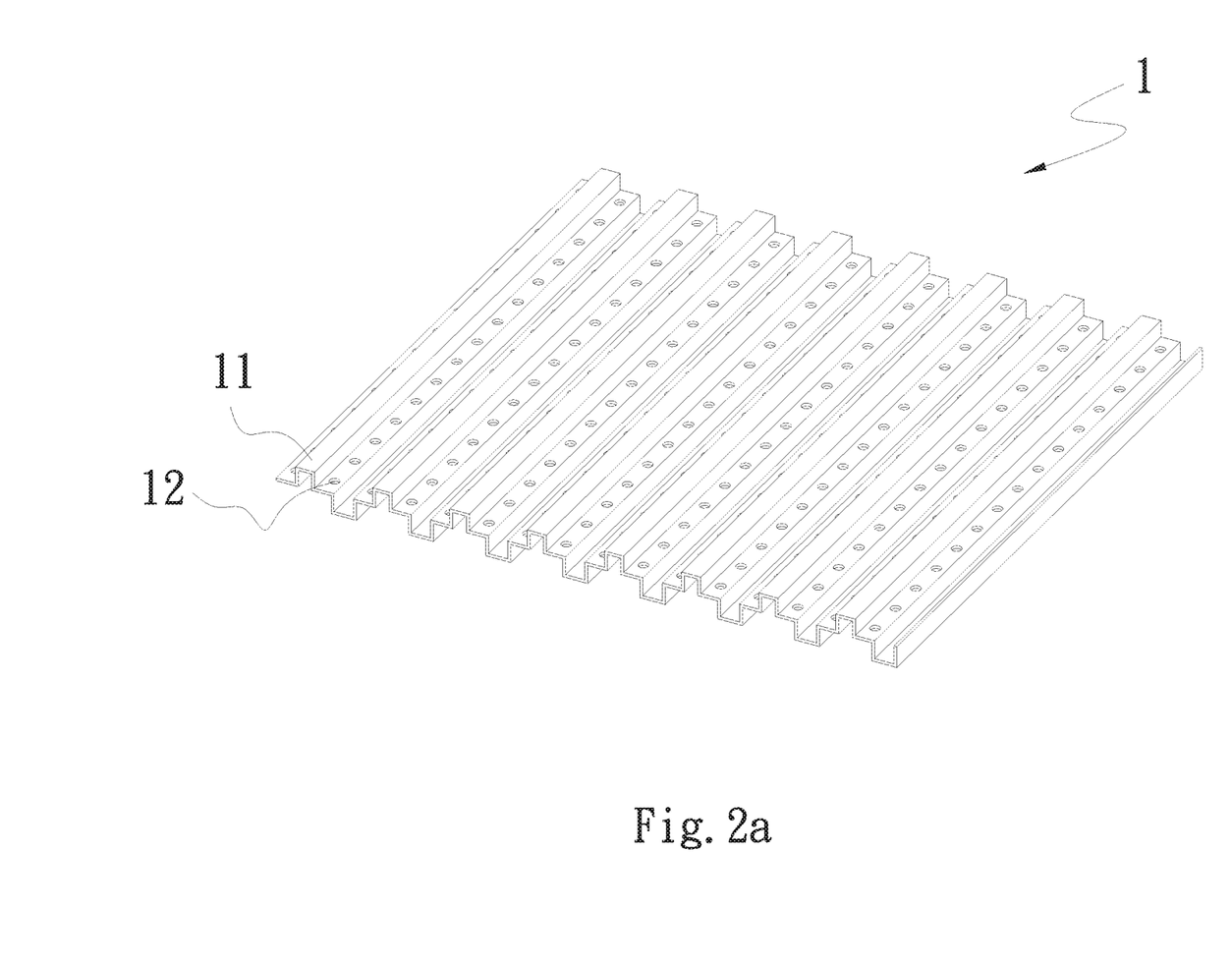
FIG. 2a is a perspective view of the first embodiment of the manufacturing method of middle member structure of the present invention.
Figure 2B:
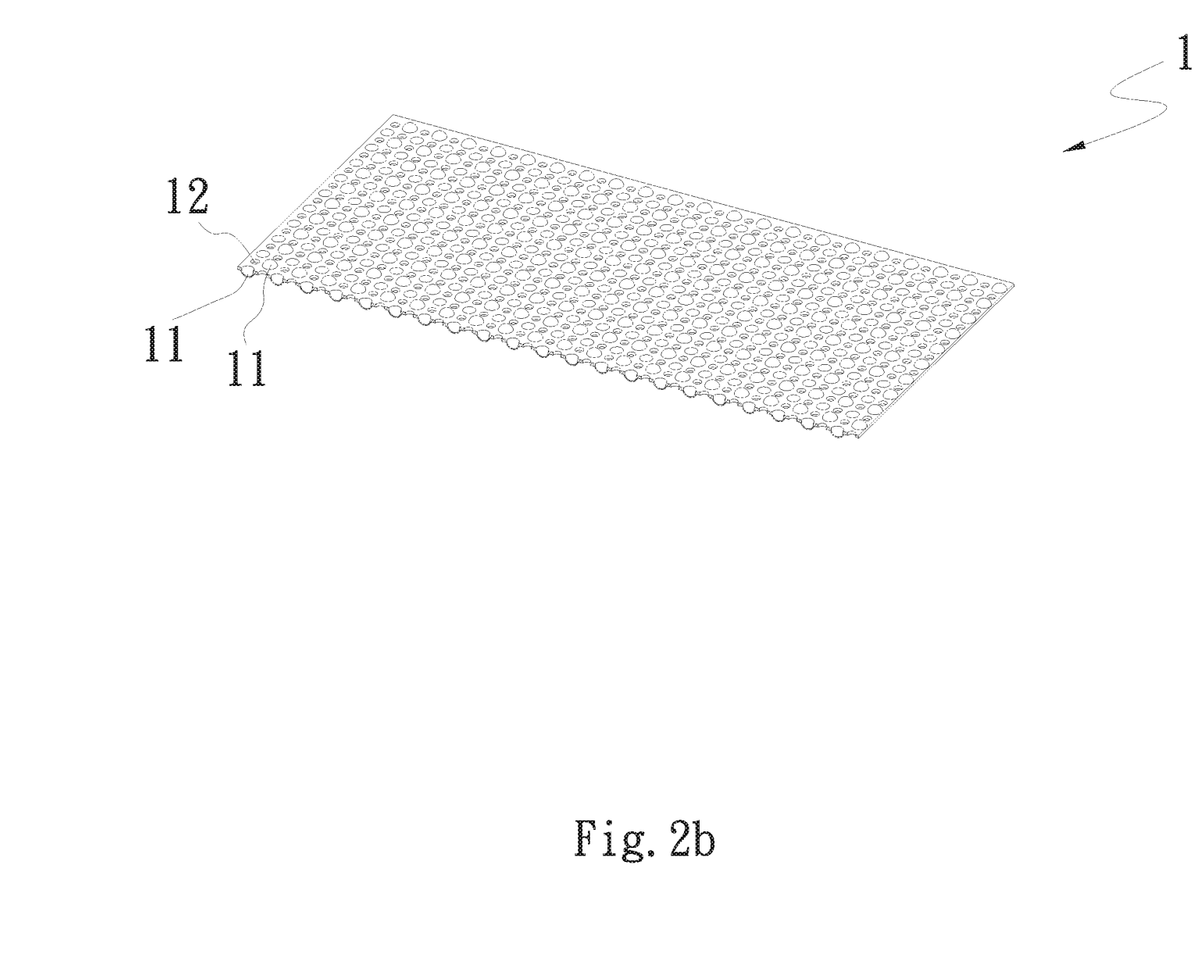
FIG. 2b is a perspective view of the first embodiment of the manufacturing method of middle member structure of the present invention.

Please refer to FIGS. 1, 2a and 2b. FIG. 1 is a flow chart of a first embodiment of the manufacturing method of middle member structure of the present invention. FIG. 2a is a perspective view of the first embodiment of the manufacturing method of middle member structure of the present invention. FIG. 2b is a perspective view of the first embodiment of the manufacturing method of middle member structure of the present invention. According to the first embodiment, the manufacturing method of middle member structure of the present invention includes steps of:

S1. providing a plate body, a plate body 1 being provided, the plate body 1 being made of a material selected from a group consisting of copper, aluminum, iron, stainless steel, commercial pure titanium, titanium alloy, aluminum alloy, copper alloy and polymer material;

S2. applying an external force to the plate body to shape the plate body and form multiple recessed/raised structures, an external force being applied to the plate body 1 to deform the plate body 1 and form multiple recessed/raised structures 11, the external force shaping being punching processing, thermoplastic processing or forging processing, in this embodiment, the external force shaping being, but not limited to, punching processing for illustration purposes, by means of punching processing, the plate body 1 being deformed to form multiple recessed/raised structures 11, the recessed/raised structures 11 being recessed from one face of the plate body 1 and correspondingly raised from the other face of the plate body 1, the recessed/raised structures 11 being horizontally alternately arranged in transverse direction and longitudinal direction of the plate body 1; and S3. perforating the plate body to form multiple perforations misaligned from the recessed/raised structures. The plate body 1 is perforated to form multiple perforations 12 misaligned from the recessed/raised structures 11. The perforations 12 are formed by means of punching processing, milling processing, drilling or laser.

Figure 3:
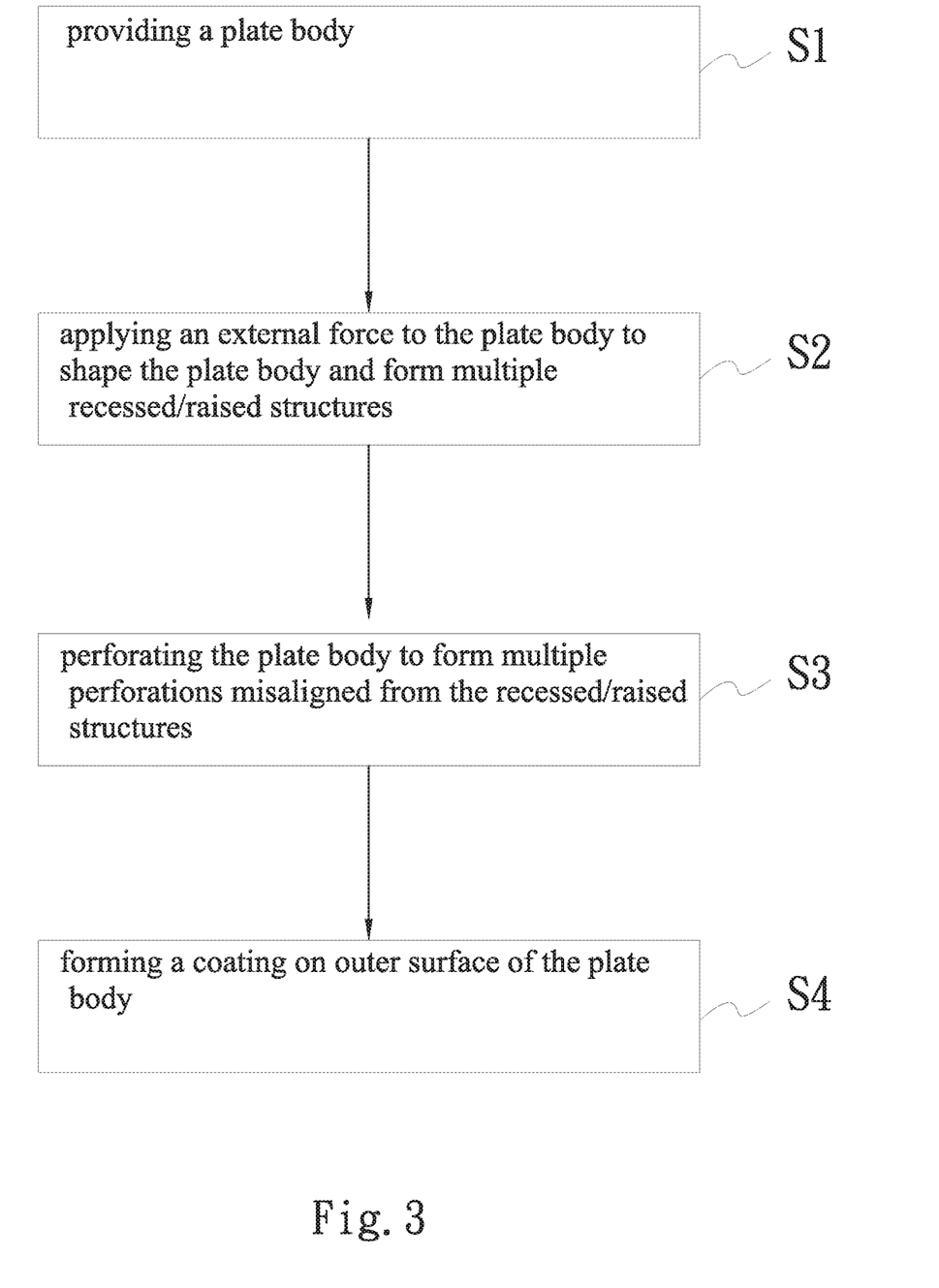
FIG. 3 is a flow chart of a second embodiment of the manufacturing method of middle member structure of the present invention.

Please now refer to FIG. 3, which is a flow chart of a second embodiment of the manufacturing method of middle member structure of the present invention. The second embodiment is partially identical to the first embodiment and thus will not be redundantly described hereinafter. The second embodiment is different from the first embodiment in that the second embodiment further includes a step S4 of forming a coating on outer surface of the plate body after the step S3 of perforating the plate body to form multiple perforations misaligned from the recessed/raised structures.

The material of the coating is selected from a group consisting of electroplating copper, electroplating aluminum, electroplating nickel and nanometer electroplating metal.

Figure 4:
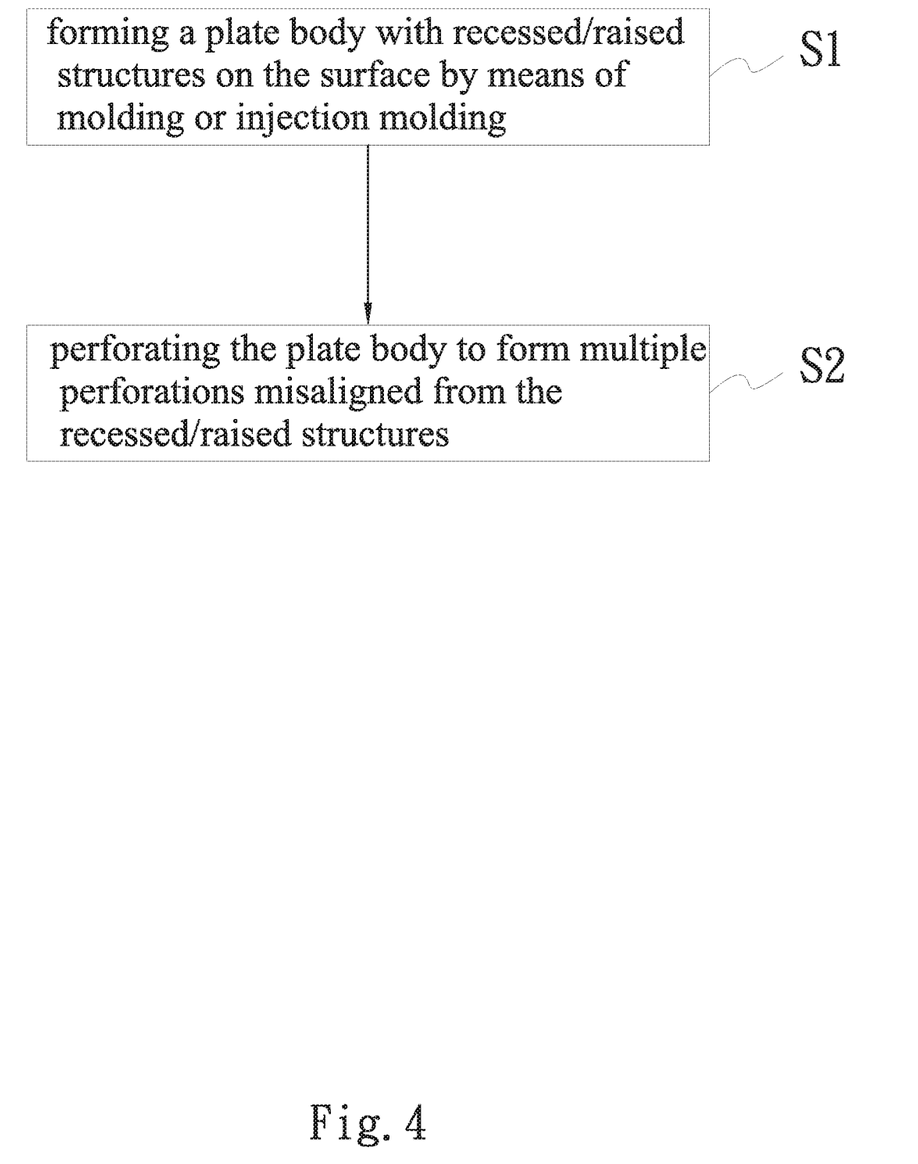
FIG. 4 is a flow chart of a third embodiment of the manufacturing method of middle member structure of the present invention.
Figure 5A:
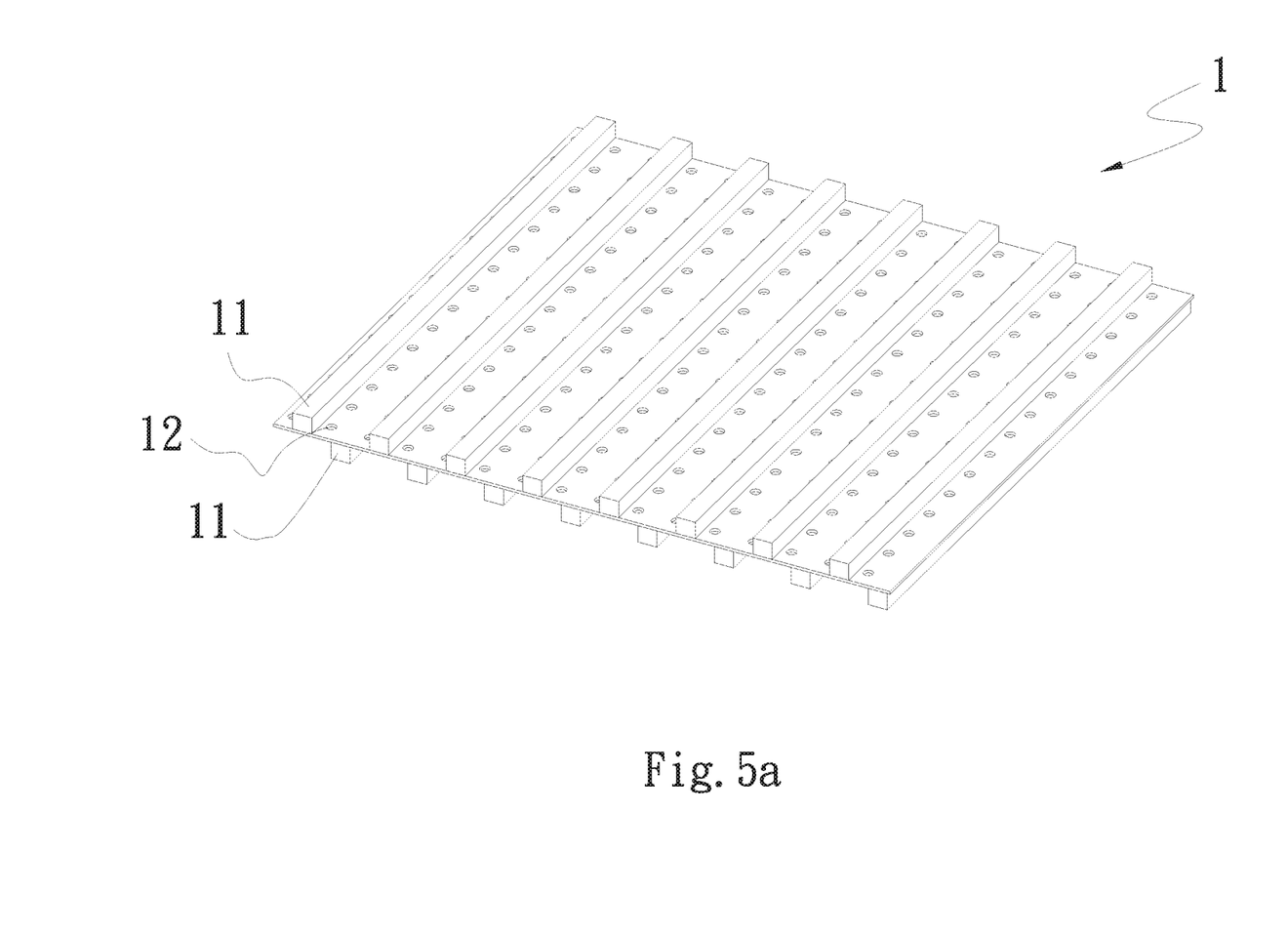
FIG. 5a is a perspective view of the third embodiment of the manufacturing method of middle member structure of the present invention.
Figure 5B:
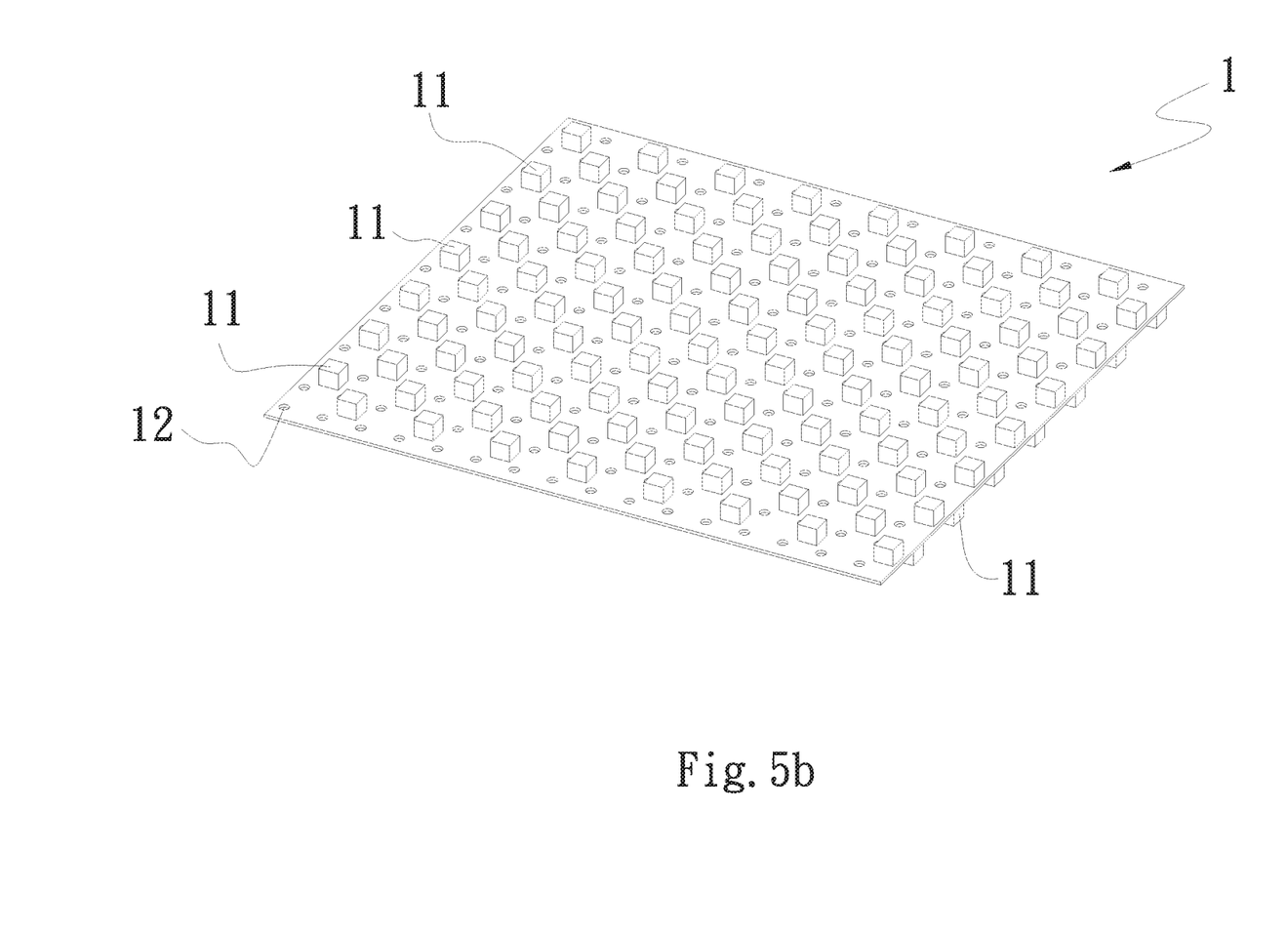
FIG. 5b is a perspective view of the third embodiment of the manufacturing method of middle member structure of the present invention.

Please now refer to FIGS. 4, 5a and 5b. FIG. 4 is a flow chart of a third embodiment of the manufacturing method of middle member structure of the present invention. FIG. 5a is a perspective view of the third embodiment of the manufacturing method of middle member structure of the present invention. FIG. 5b is a perspective view of the third embodiment of the manufacturing method of middle member structure of the present invention. According to the third embodiment, the manufacturing method of middle member structure of the present invention includes steps of:

S1. forming a plate body with recessed/raised structures on the surface by means of molding or attachment or injection molding, by means of molding or injection molding, bar-shaped or granule-shaped structures being disposed one surface or two surfaces of a plate body 1, alternatively, a molten material being filled into a mold to form the plate body 1 with recessed/raised structures 11 on the surface at one time, the recessed/raised structures 11 being horizontally alternately arranged in transverse direction and longitudinal direction of the plate body 1, the plate body 1 being made of a material selected from a group consisting of copper, aluminum, iron, stainless steel, commercial pure titanium, titanium alloy, aluminum alloy, copper alloy and polymer material; and S2. perforating the plate body to form multiple perforations misaligned from the recessed/raised structures. The plate body 1 is perforated to form multiple perforations 12 misaligned from the recessed/raised structures 11. The perforations 12 are formed by means of punching processing, milling processing, drilling or laser.

Figure 6:
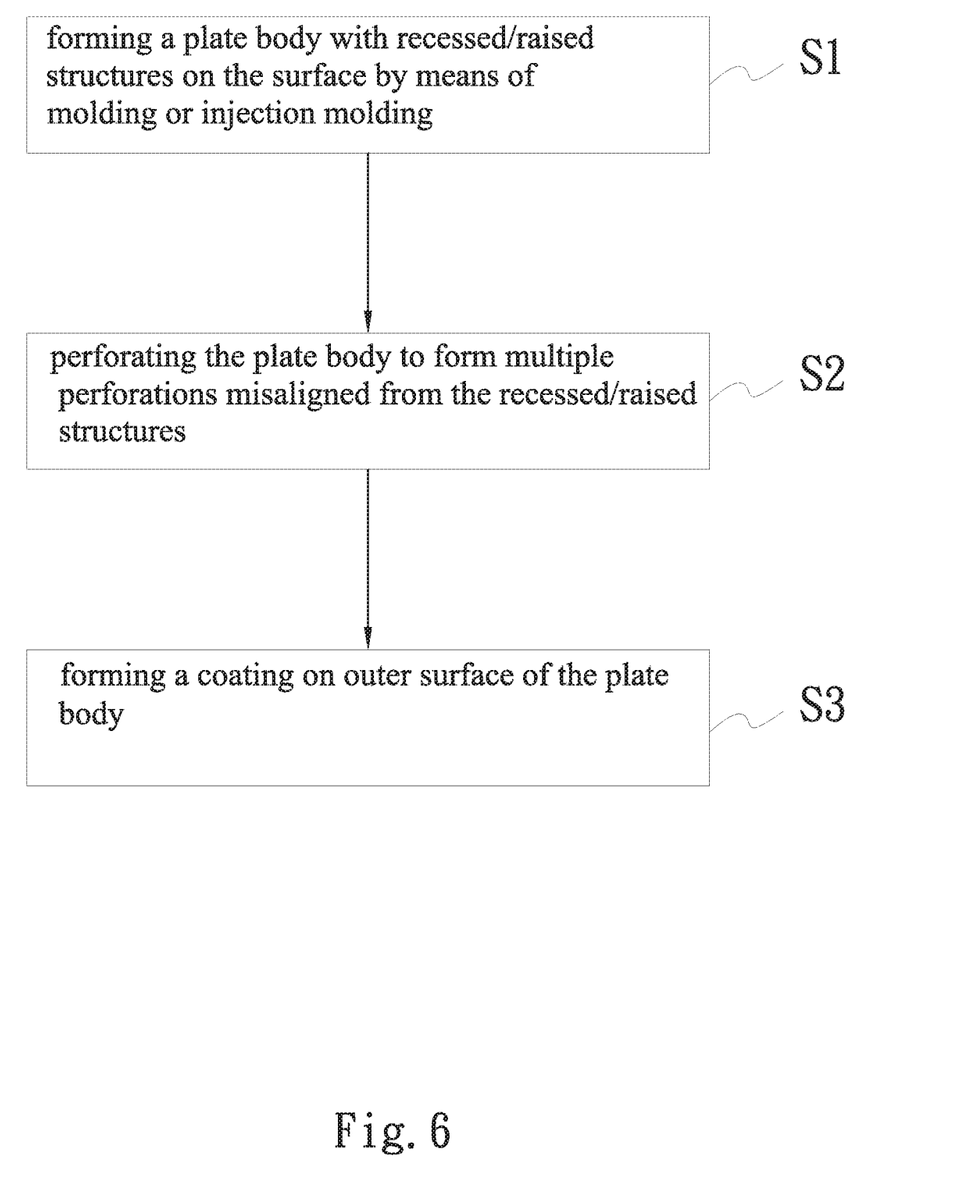
FIG. 6 is a flow chart of a fourth embodiment of the manufacturing method of middle member structure of the present invention.

Please now refer to FIG. 6, which is a flow chart of a fourth embodiment of the manufacturing method of middle member structure of the present invention. The fourth embodiment is partially identical to the third embodiment and thus will not be redundantly described hereinafter. The fourth embodiment is different from the third embodiment in that the fourth embodiment further includes a step S3 of forming a coating on outer surface of the plate body after the step S2 of perforating the plate body to form multiple perforations misaligned from the recessed/raised structures.

The material of the coating 13 is selected from a group consisting of electroplating copper, electroplating aluminum, electroplating nickel and other nanometer electroplating metal.

Figure 7:
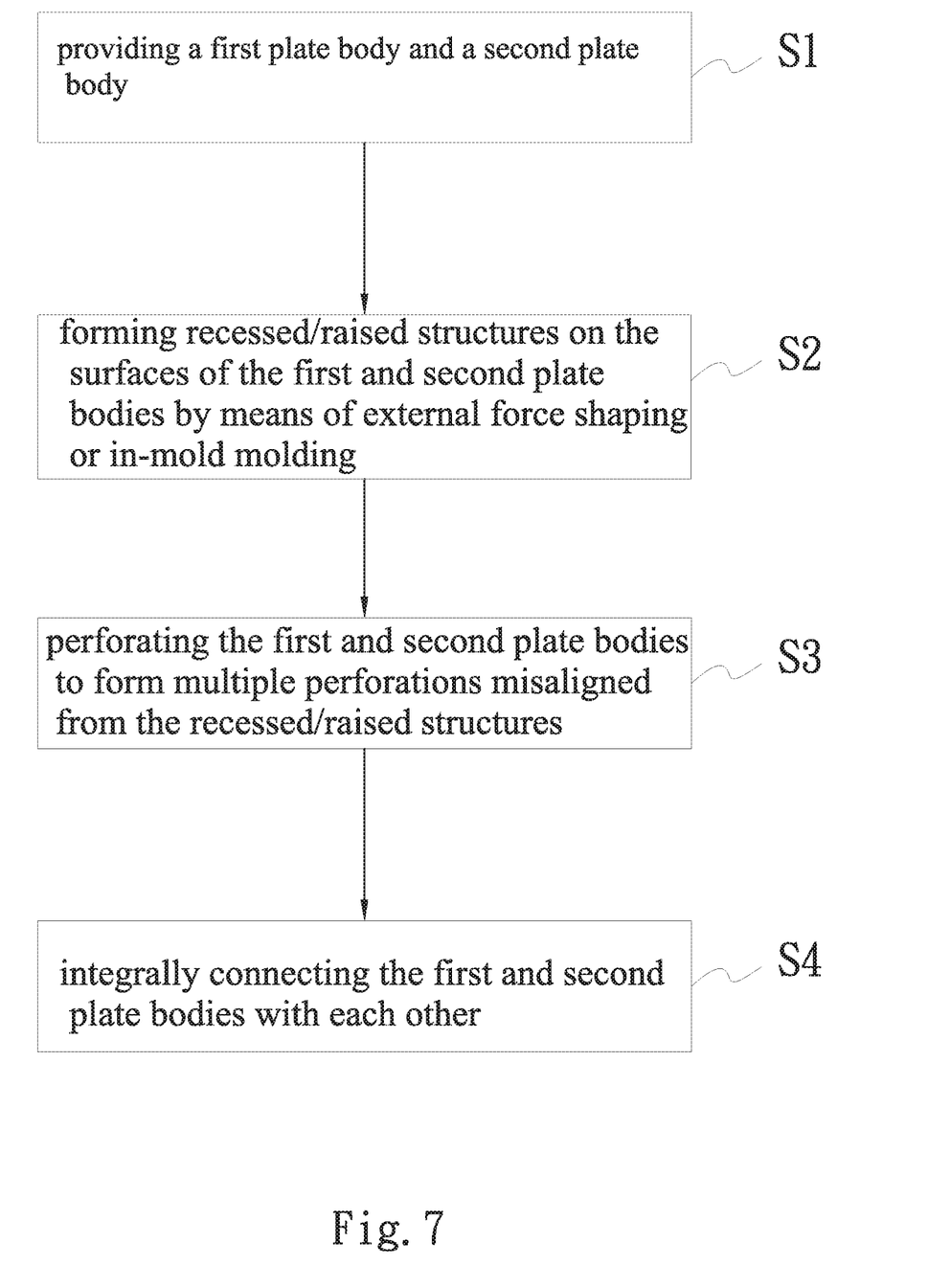
FIG. 7 is a flow chart of a fifth embodiment of the manufacturing method of middle member structure of the present invention.
Figure 8A:
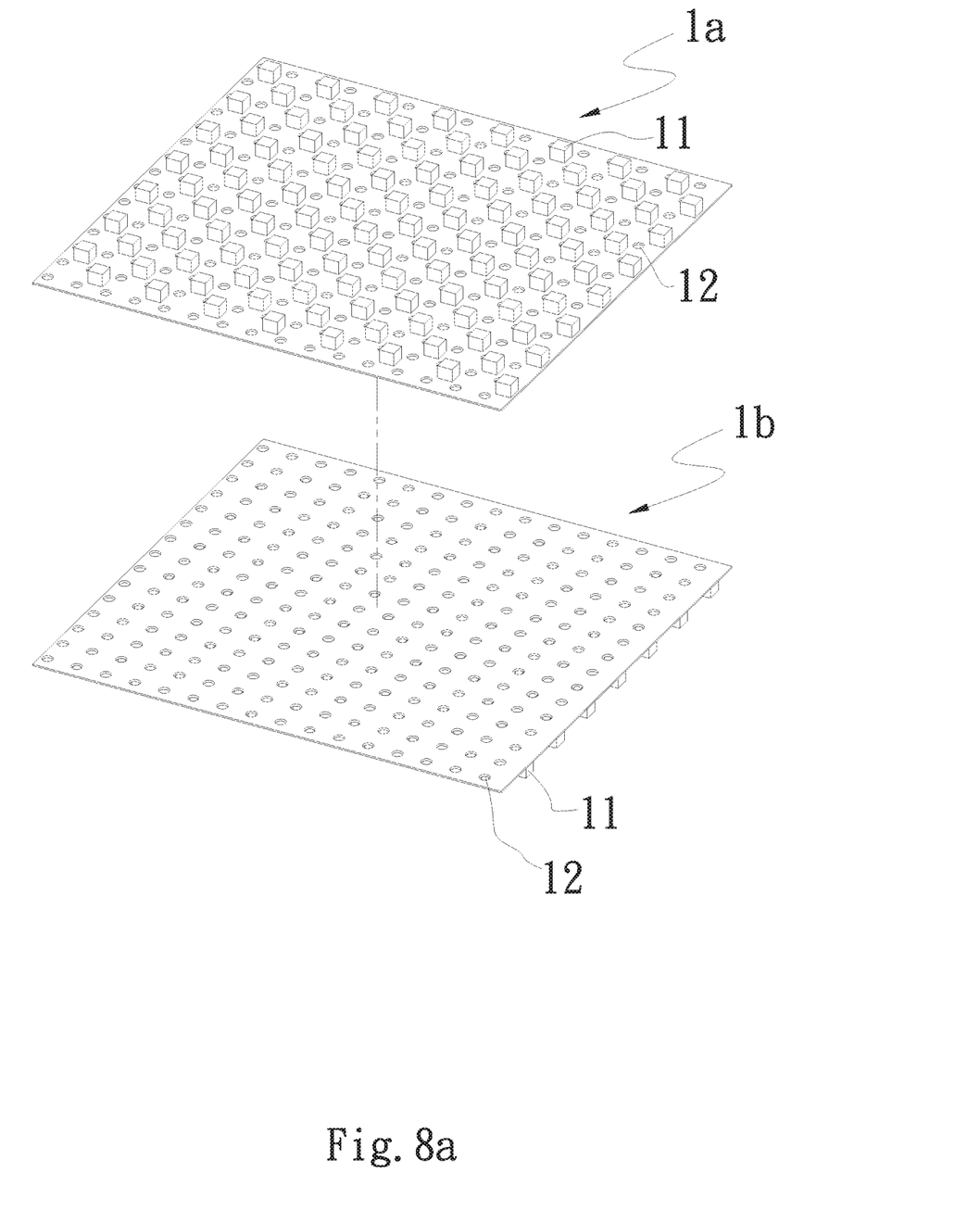
FIG. 8a is a perspective view of the fifth embodiment of the manufacturing method of middle member structure of the present invention.
Figure 8B:
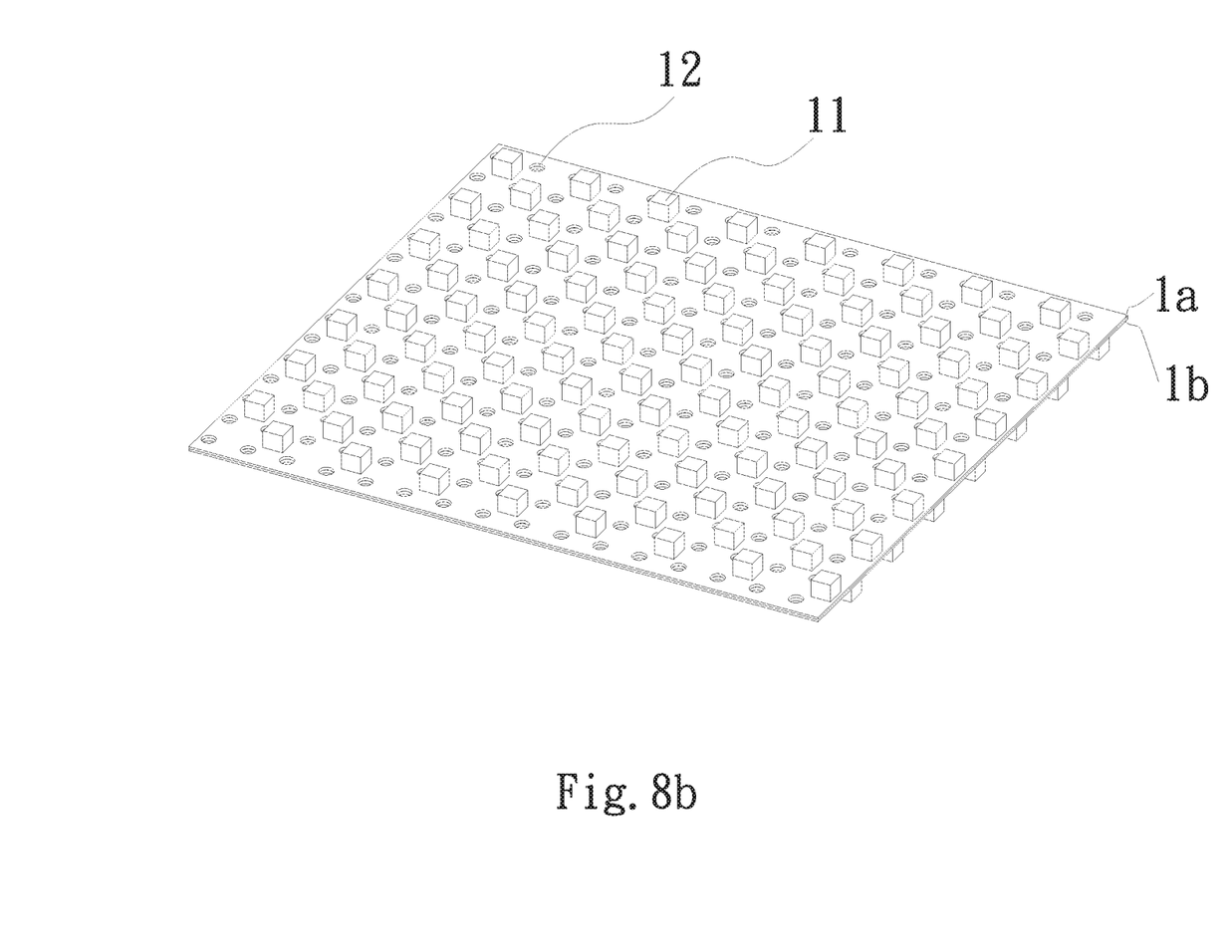
FIG. 8b is a perspective view of the fifth embodiment of the manufacturing method of middle member structure of the present invention.

Please now refer to FIGS. 7, 8a and 8b. FIG. 7 is a flow chart of a fifth embodiment of the manufacturing method of middle member structure of the present invention. FIG. 8a is a perspective view of the fifth embodiment of the manufacturing method of middle member structure of the present invention. FIG. 8b is a perspective view of the fifth embodiment of the manufacturing method of middle member structure of the present invention.

According to the fifth embodiment, the manufacturing method of middle member structure of the present invention includes steps of:

S1. providing a first plate body and a second plate body, a plate body 1a and a second plate body 1b being provided, the first and second plate bodies 1a, 1b being made of a material selected from a group consisting of copper, aluminum, iron, stainless steel, commercial pure titanium, titanium alloy, aluminum alloy, copper alloy and polymer material;

S2. forming recessed/raised structures on the surfaces of the first and second plate bodies by means of external force shaping or in-mold molding, by means of applying an external force to the first and second plate bodies 1a, 1b or in-mold molding, the first and second plate bodies 1a, 1b being deformed to form recessed/raised structures 11, the external force shaping being punching processing, thermoplastic processing or forging processing, in this embodiment, the external force shaping being, but not limited to, punching processing for illustration purposes, by means of punching processing, the first and second plate bodies 1a, 1b being deformed to form multiple recessed/raised structures 11, the recessed/raised structures 11 being recessed from one face of the first and second plate bodies 1a, 1b and correspondingly raised from the other face of the first and second plate bodies 1a, 1b, the recessed/raised structures 11 being horizontally alternately arranged in transverse direction and longitudinal direction of the first and second plate bodies 1a, 1b;

S3. perforating the first and second plate bodies to form multiple perforations misaligned from the recessed/raised structures, the first and second plate bodies 1a, 1b being perforated to form multiple perforations 12 misaligned from the recessed/raised structures 11, the perforations 12 being formed by means of punching processing, milling processing, drilling or laser; and S4. integrally connecting the first and second plate bodies with each other. The first and second plate bodies 1a, 1b are integrally connected with each other by means of welding, adhesion or press fit.

Figure 9:
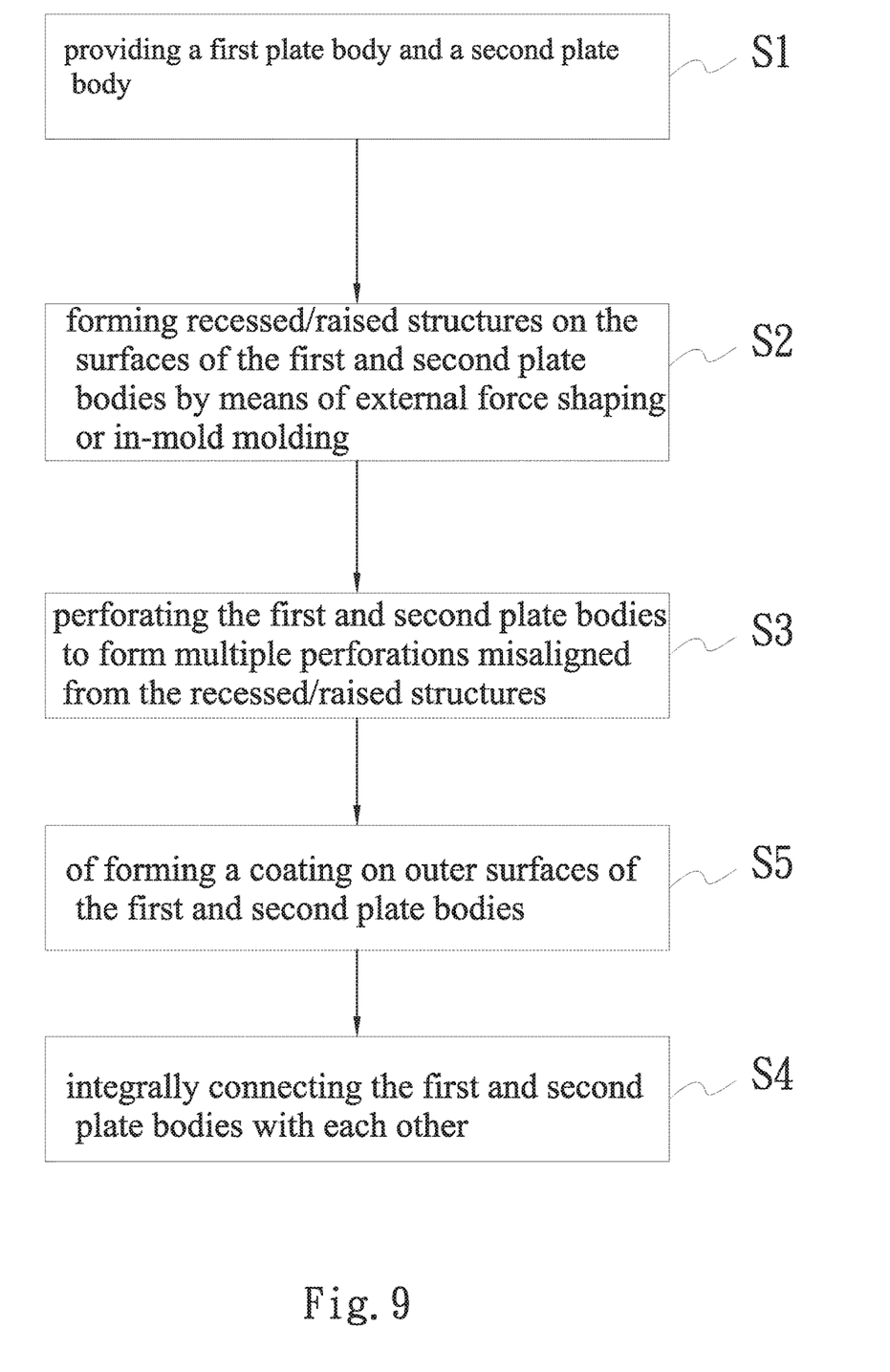
FIG. 9 is a flow chart of a sixth embodiment of the manufacturing method of middle member structure of the present invention.

Please now refer to FIG. 9, which is a flow chart of a sixth embodiment of the manufacturing method of middle member structure of the present invention. The sixth embodiment is partially identical to the fifth embodiment and thus will not be redundantly described hereinafter. The sixth embodiment is different from the fifth embodiment in that the sixth embodiment further includes a step S5 of forming a coating on outer surfaces of the first and second plate bodies 1a, 1b after the step S3 of perforating the plate body to form multiple perforations misaligned from the recessed/raised structures.

The material of the coating 13 is selected from a group consisting of electroplating copper, electroplating aluminum, electroplating nickel and other nanometer electroplating metal.

The present invention provides a manufacturing method of middle member structure. The middle member structure made by the manufacturing method is applicable to a vapor chamber or a flat-plate heat pipe to truly effectively enhance the support and the vapor-liquid circulation effect.

The present invention has been described with the above embodiments thereof and it is understood that many changes and modifications in such as the form or layout pattern or practicing step of the above embodiments can be carried out without departing from the scope and the spirit of the invention that is intended to be limited only by the appended claims.

What is claimed is:

1. A method of manufacturing a support middle member structure, comprising steps of: providing a plate body defining a flat plane; applying an external force to the plate body to shape the plate body and form multiple recessed and raised structures, said structures being recessed and raised from said flat plane; and perforating the plate body to form multiple perforations misaligned from the recessed and raised structures, said perforations being formed in the plate body in said flat plane.

2. The method of claim 1, wherein the external force shaping is one of a punching process, a thermoplastic process, or an in-mold molding process.

3. The manufacturing method of middle member structure as claimed in claim 1, wherein the perforations are formed by means of punching processing, milling processing, drilling or laser.

4. The method of claim 1, wherein the plate body is made of a material selected from a group consisting of copper, aluminum, iron, stainless steel, commercial pure titanium, titanium alloy, aluminum alloy, copper alloy and polymer material.

5. The method of claim 1, wherein the recessed and raised structures are recessed from one face of the plate body and correspondingly raised from the other face of the plate body.

6. The method of claim 1, wherein the recessed and raised structures are horizontally alternately arranged in transverse direction and longitudinal direction of the plate body.

7. The method of claim 1, and further comprising a step of forming a coating on outer surface of the plate body after the step of perforating the plate body.

8. The method of claim 7, wherein the material of the coating is selected from a group consisting of electroplated copper, electroplated aluminum, electroplated nickel and nanometer electroplated metal.

* * * * *